United States Patent [19]

Kasner et al.

[11] Patent Number: 4,789,770

[45] Date of Patent: Dec. 6, 1988

[54] CONTROLLED DEPTH LASER DRILLING SYSTEM

[75] Inventors: William H. Kasner, Penn Hills; James F. Roach, Oakmont; Vincent A. Toth, Penn Township, Westmoreland County, all of Pa.

[73] Assignee: Westinghouse Electric Corp., Pittsburgh, Pa.

[21] Appl. No.: 73,610

[22] Filed: Jul. 15, 1987

[51] Int. Cl.[4] .............................................. B23K 26/00
[52] U.S. Cl. ........................... 219/121.7; 219/121.76; 219/121.71; 219/121.74; 219/121.75
[58] Field of Search ................. 219/121 LK, 121 LL, 219/121 LQ, 121 LR, 121 LS, 121 LB

[56] References Cited

U.S. PATENT DOCUMENTS

| | | | |
|---|---|---|---|
| 3,485,996 | 12/1969 | Chiou et al. | 219/121 LB X |
| 3,689,159 | 9/1972 | Taniguchi et al. | 219/121 X |
| 4,044,222 | 8/1977 | Kestenbaum | 219/121 LM |
| 4,238,741 | 12/1980 | Kasner et al. | 331/94.5 PE |
| 4,240,094 | 12/1980 | Mader | 219/121 LD |
| 4,466,739 | 7/1984 | Kasner et al. | 219/121 LV X |
| 4,501,787 | 2/1985 | Marchetti et al. | 428/236 |
| 4,504,727 | 3/1985 | Melcher et al. | 219/121 LB |
| 4,532,400 | 7/1985 | Toida et al. | 219/121 LS X |
| 4,536,108 | 8/1985 | Saxton et al. | 408/230 |
| 4,544,442 | 10/1985 | Lassen | 219/121 LJ X |
| 4,550,240 | 10/1985 | Toida et al. | 219/121 LS |
| 4,695,697 | 9/1987 | Kosa | 219/121 LZ |

OTHER PUBLICATIONS

W. R. Wrenner, "Generating Small Holes for IBM's New LSI Package Design", IPC-TP-446; IPC Fall Meeting, Oct. 1982.

L. Fenichel, "Laser Drilling: Not A Boring Story", *Circuits Manufacturing*, vol. 24, Feb. 1984, pp. 49–54.

*Primary Examiner*—C. L. Albritton
*Attorney, Agent, or Firm*—Daniel P. Cillo

[57] ABSTRACT

A controlled depth laser drilling system for a workpiece containing metallic conductors is provided having at least one laser beam (56 and/or 57 of FIG. 5) where a portion of the laser beam (44) will be reflected from the workpiece and back to a drilling depth monitoring means (43) containing optical means capable of reflecting a portion of the original and reflected laser beams into radiation detector means (46', 46" and/or 45', 45"), where the detector means are capable of converting the radiation received into a measurable electrical signals.

18 Claims, 4 Drawing Sheets

CONTROLLED DEPTH LASER DRILLING SYSTEM

BACKGROUND OF THE INVENTION

1. Field of the Invention

The present invention relates to a controlled depth laser drilling system which utilizes optical means to transmit original laser beam radiation, and transmit laser beam radiation reflected from a workpiece, to a radiation detector. This detector is capable of converting the reflected radiation to measurable electrical signals.

2. Description of the Prior Art

Printed circuit boards having a plurality of layers and containing top and embedded copper or other type metal foil, and electrically conducting vias with plated through-holes and blind-holes are well known, and taught, for example by Marchetti et al., in U.S. Pat. No. 4,501,787. In the past, such through holes and blind holes have been mechanically drilled. However, even the most modern mechanical microdrilling technology, for example that taught by Saxton et al., in U.S. Pat. No. 4,536,108, cannot provide drilled holes smaller than about 4 mil (0.004 inch). Such holes are drilled by miniature drill bits in conjunction with depth sensors. Such miniature drills sustain significant cutting edge damage when drilled through some modern circuit board substrates, such as epoxy resin impregnated glass cloth, and therefore have a limited life. Such miniature drills are also expensive and subject to a wide variety of torque, thrust, friction and deflection forces, resulting in a high rate of microdrill breakage. Also, existing equipment using miniature drills is designed to drill boards in three board stacks at a rate of about 200 inches per minute. Boards requiring microholes cannot be stacked, and the feed rate drops to about 50 inches per minute, an overall efficiency loss of about 12/1.

Mader, in U.S. Pat. No. 4,240,094, used a variety of laser beam deflecting optics, a final objective lens, and a viewing camera, operating through a partially reflective, partially transmissive mirror, to cause a laser beam to selectively disconnect semiconductor connection paths, and to interconnect metalization connection paths to selected semiconductor materials, on the top surface of a large scale integrated circuit module. In 1977 Kestenbaum, in U.S. Pat. No. 4,044,222, taught short-pulsed, tapered aperture formation in thin films, such as silicon dioxide, silicon nitride and tantalum oxides, using a Q-switched $CO_2$ laser, or a cavity dumped or mode-locked YAG (yttrium aluminum garnet) laser. These films, about 400 Angstrom Units to about 10,000 Angstrom Units thick, were usually deposits on semiconductor substrates.

From about 1980, experimental $CO_2$ laser drilling of circuit boards expanded. W. Wrenner, in "Generating Small Holes For IBM's New LSI Package Design", IPC-TP-446, IPC Fall Meeting, October 1982, generally describes plated, laser drilled blind and through-hole technology for advanced circuit board package designs. A pulsed $CO_2$ laser was used to drill epoxy glass substrates through a copper mask. Use of a single laser to drill multiple parts was also described. L. Fenichel, in *Circuits Manufacturing*, Vol. 24, February 1984, pp. 49-54, describes two commercial $CO_2$ laser drilling systems useful for drilling blind holes in copper clad, epoxy-glass laminates through a copper mask. Neither of these articles goes into great detail about the laser optics systems.

Toida et al., in U.S. Pat. Nos. 4,532,400 and 4,550,240, teach use of dual lasers, various reflector means, and articulated arm and fiber optic beam guides to allow surgical cutting of tissue by a $CO_2$ laser beam and coagulation of blood by a YAG laser beam. There, a He—Ne laser is used to output a visible, red first guide beam, and a halogen lamp is used to output a visible, white second guide beam, which beams are used in conjunction with invisible $CO_2$ and YAG laser beams. The visible beams are mixed with the invisible $CO_2$ and YAG beams, by an assembly of reflecting and dichroic mirrors, to provide the output beams. Four operating modes are taught: coaxial irradiation of $CO_2$ and YAG laser beams with the He—Ne visible red beam through an articulated arm light guide; irradiation of the $CO_2$ laser beam with the He—Ne visible red beam through an articulated arm light guide; irradiation of the YAG laser beam with the He—Ne visible red beam through an articulated arm light guide; and irradiation of the YAG laser beam with the halogen lamp visible white beam through a fiber optic light guide.

Lassen, in U.S. Pat. No. 4,544,442, teaches pulsed laser and other type drilling of 6 mil to 12 mil diameter holes in organic, compact microelectronic substrate packages, having round and foil conductors disposed in a pattern therein. The laser drilling provides access to the round, or both the round and the foil conductors. The drilling is followed by metal plating of the hole and exposed conductors. The preferred laser is a $CO_2$ laser applied vertically to the workpiece through a mirror and mirror head, when metal conductors are used. Such drilling is achieved, by in some fashion using the contrast between the reflective power of the metallic conductors to a $CO_2$ laser beam, and the absorptive power of the organic substrate. The organic material could also be removed with other type lasers, a controlled depth mechanical drill, a modulated stream of abrasive particles or a water jet stream of chemicals. The problem with the Lassen system is that one would never be quite sure of hole penetration depth if laser beams are used, so that if small round conductors are used, the hole may be drilled substantially beyond the conductor.

Melcher et al., in U.S. Pat. No. 4,504,727, teach laser drilling of multilayer printed circuits. They monitor drilling depth by utilizng a real time, photoacoustic feedback control. Melcher et al. teach use of solid state photoacoustic spectroscopy, where light energy is absorbed by a solid, which energy is converted into an acoustic signal which is characteristic of that solid, and then converted into an electrical signal for analysis. The primary source of the acoustic signal arises from the periodic, time-dependent heat flow, caused by laser vaporization of solids, from the solid to the surrounding gas. The acoustic signal is typically detected by a microphone. The lasers suggested were a Nd/YAG laser or a $CO_2$ laser. This type of feedback control monitors and amplifies a noise-free signal from the drilling laser via a laser beam splitter and infrared radiation sensor combination, and also a signature, noise containing signal from a piezoelectric sensor or microphone close to the workpiece, which signal must be filtered and amplified. Such a system is very complicated, requiring very sophisticated acoustic monitors and filters. What is needed is a less expensive, less complicated, purely optical, drill depth control system.

OBJECT OF THE INVENTION

It is an object of this invention to provide a laser drilling system capable of drilling very small diameter holes. In combination with a drilling depth monitoring system utilizing reflected laser beam feedback through an optical system to radiation detectors.

SUMMARY OF THE INVENTION

The above needs and objects have been met by the present invention which, in its broadest aspect, provides a controlled depth laser drilling system for a workpiece containing metallic conductors, where the term "drilling" means penetrating or making a hole through the workpiece. The laser drilling system contains at least one laser transmitting means for emitting an original laser beam capable of drilling into a workpiece, where a portion of the original laser beam radiation will be reflected from the workpiece and measured. The system further contains optical means containing: at least one optical element capable of focusing the laser beam, and at least one optical element capable of reflecting a portion of the reflected laser beam into a radiation detector means, where the detector means is capable of converting the laser radiation into an electrical signal.

More specifically, the invention provides, preferably, a dual laser drilling system, which has a short wavelength laser beam capable of penetrating metal, and a long wavelength laser beam reflective from metal. This drilling system is used in conjunction with optical means capable of transmitting laser beam radiation reflected from the workpiece to a radiation detector capable of receiving and converting said radiation transmitted to an electrical signal, and means to quickly measure said electrical signal.

Preferably, the metal penetrating laser beam has a wavelength of, for example, from about 0.4 micron to about 3 microns. The preferred metal reflective laser beam has a wavelength of, for example, from about 8 microns to about 15 microns. This combination of lasers is capable of drilling holes as small as 1 mil (0.001 inch=0.0254 millimeter) diameter in a substrate workpiece containing metallic conductors disposed on the surface of or within the body of a laminate.

In this invention, the metal penetrating laser beam can be used to drill through a top metal cladding or top via, supported on an organic-based insulating substrate, such as epoxy resin or polyimide resin impregnated glass fibers. Then, the metal reflecting laser beam can be used to drill through the substrate to a precisely positioned, internally disposed metal wire or foil, or to a bottom metal cladding, or bottom metal via. The metal reflecting laser beam upon contacting the internal or bottom metal surface will have a major portion of its radiation reflected. This invention can, through a series of reflecting, transparent, and apertured optical elements, provide simultaneous or consecutive use and focusing of the laser beams, and direct the reflected radiation into radiation detectors. The detectors can emit electrical signals which can be instantaneously measured, to allow control of the drilling operation by turning the lasers on or off. For example, the completion of a blind-hole, i.e., a hole drilled through organic to a metal surface, by the metal reflecting laser beam, will be detected by the increase in the reflected radiation received by a detector.

Without the reflected radiation optical system, it is very difficult to judge when the metal surface is reached by purely optical means, and continued radiation input may provide a large void near to and around the metal, which void is difficult to plate. In some cases, continued laser application, even for a very short period, can cause a bulge-out or even a puncture of the metal.

After drilling the holes in the substrate by the process of this invention, they will be slightly tapered from the top to bottom, and capable of being metal-plated. Using the laser drilling principles described, where one or both lasers are used, complex drilling operations of 1 mil to 12 mil (0.0254 mm to 0.3 mm) diameter holes in a variety of circuit boards laminates would be possible by a single drilling station operating at a relatively rapid feed rate. This technique is laser drilling, which indicates when a metal surface is contacted within the circuit board, can be an important method for making interconnections in advanced, high density microelectronic packages required for very large scale integrated circuits (VLSI) and printed wiring board (PWB) modules, and, of course, the "bit" that is the focused laser beam has no wear at all. This laser drilling method is most useful when a series of blind-holes must be made in a workpiece, requiring use of both laser types. The laser drilling does not utilize any photoacoustic feedback, but relies solely on the difference in radiation (usually infrared radiation) detected from workpiece reflected sources.

BRIEF DESCRIPTION OF THE DRAWINGS

The invention will become more readily apparent from the following description of preferred embodiments thereof shown, by way of example only, in the accompanying drawings, wherein.

DESCRIPTION OF THE PREFERRED EMBODIMENTS

Figure 1:
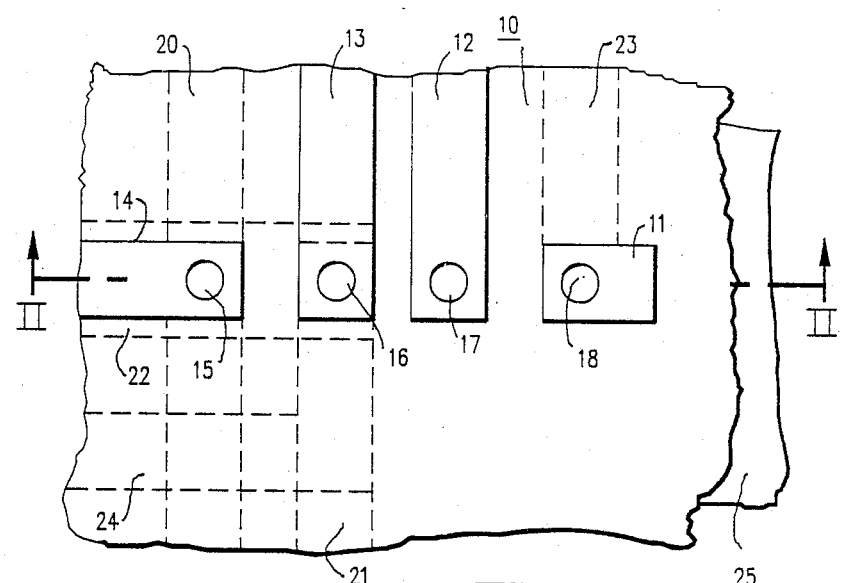
FIG. 1 is a top view of a multilayer circuit board showing a through-hole, three blind-holes, and top and embedded metallic via patterns.

Referring now to FIG. 1 of the Drawings, a portion of the top of a drilled workpiece 10 is shown, in this case a multilayer circuit board laminate. Top metal vias 11, 12, 13 and 14 are shown. These metal vias are electrical conductors, usually made of copper or aluminum foil about 0.25 mil to 5 mil thick (0.00025 inch to 0.005 inch=0.0063 mm to 0.127 mm), most typically about 0.75 mil to 2.5 mil thick (0.02 mm to 0.06 mm). Holes 15, 16, 17 and 18 through the metal vias are also shown, as well as embedded metal wire 20, embedded metal vias 21, 22, 23, and 24, and bottom metal cladding sheet 25, best seen in FIG. 2, which is a cross section through the workpiece of FIG. 1 along line II—II. Holes 15, 17, and 18 are "blind-holes," i.e., holes that pass through the body of the laminate, and end at either an embedded wire, via, or the bottom metal cladding sheet. Hole 16 is a "through-hole," i.e., a hole that passes through the entire laminate.

Figure 2:
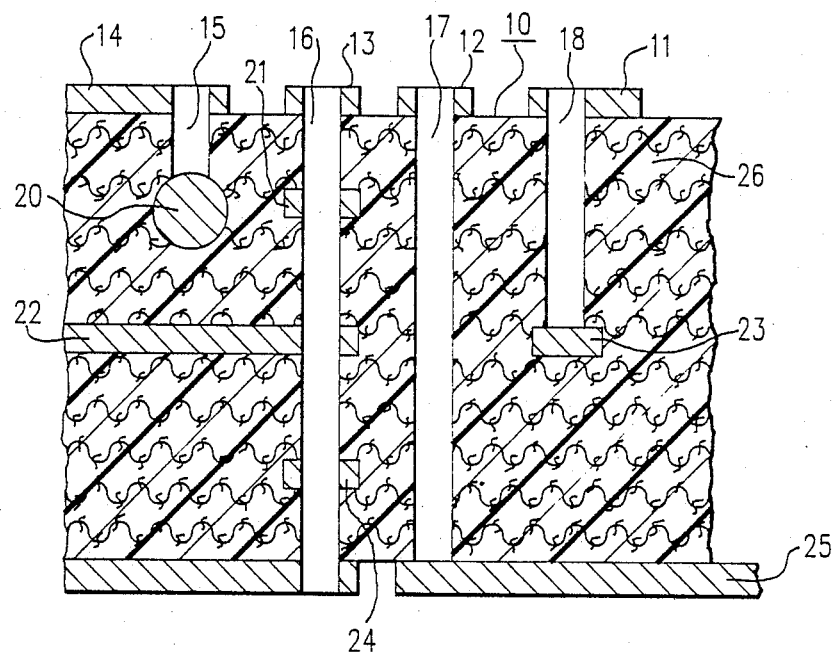
FIG. 2 is a cross-sectional view, across II—II of FIG. 1, showing the through-hole and the three blind-holes.

The laminate 26, shown in FIG. 2, can be made from plural layers of resin impregnated fibrous sheet material. The fibrous sheet can be woven or unwoven glass fibers, high purity fibrous quartz, aromatic polyamide fibers (such as Kevlar), polyethylene terephthalate fibers (such as Dacron), cellulosic paper fibers (such as Kraft paper), and the like. A laminate may also contain mixtures of fibrous sheet material, for example a top layer of impregnated glass cloth and a base of impregnated cellulosic fibers, such as Kraft paper. The laminate may comprise two to eight or more sheets, with a total laminate thickness of from about 4 mil to 250 mil (0.1 mm to 6.3 mm), usually about 20 mil to 120 mil (0.5 mm to 3 mm).

Useful resins for impregnating the laminate sheets can include phenolic resins, polyester resins, polyimide resins, polytetrafluoroethylene (such as Teflon), and the like resins, or most preferably epoxy resins, all of which are well known in the art. In many instances a flame retardant epoxy resin is most preferred. Useful flame retardant epoxy resins can include brominated epoxy resin; or a mixture of non-halogenated epoxy resin such as bisphenol A epoxy, cycloaliphatic epoxy, novolac epoxy or their mixtures, with a flame retarding reactive additive containing, for example, bromine and phenolic hydroxyl groups, preferably tetrabromobisphenol A. A phenolic novolac can be used as the curing agent, among others, and optional catalysts could include tertiary amines, imidazoles, and the like. Additional flame retardant additives, to impart an additional degree of flame resistance, can include antimony trioxide, antimony pentoxide, and various phosphates. A detailed description of useful resins, substrates and metal foil application techniques can be found in U.S. Pat. No. 4,501,787, herein incorporated by reference.

Figure 3:
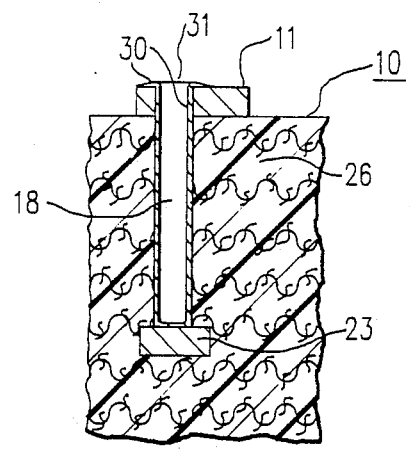
FIG. 3 is a sectional view of a portion of FIG. 2, showing a metal-plated blind-hole, and the connection between a top and imbedded metal via.

FIG. 3 shows a detailed view of a metal-plated blind hole 18, laser-drilled by the invention apparatus. Plating 30 is with copper and the like metal, usually by a combination of electrodeless and electroplating techniques, to provide electrical leads through the circuit board to connect various imbedded wires or vias. In many instances, electrical components, such as diodes, transistors and the like are soldered to a top conductor pad, for example at position 31. As shown, drilling holes by the method of this invention provides a clean bottom contact at metal via 23, with a minimal cavity or void on the sides of the via which would create plating problems.

Figure 4:
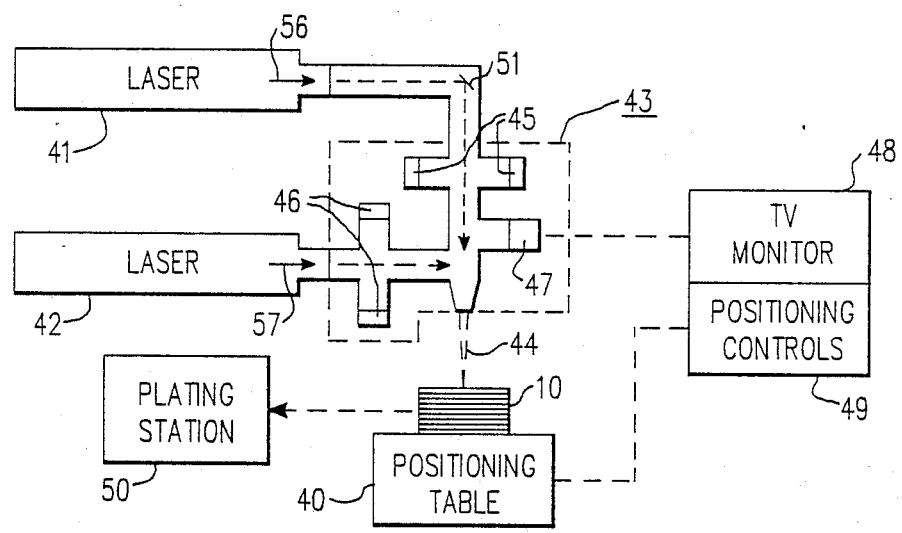
FIG. 4 is a schematic diagram of one embodiment of the laser drilling system of this invention.

FIG. 4 shows, in general, one embodiment of the preferred, dual laser drilling system of this invention, which may be used, for example, to precisely laser drill blind holes and through holes in a wide variety of workpieces, such as those shown in the multilayer circuit board laminate of FIGS. 1 to 3. Each laser can be used separately or both can be used at the same time.

Workpiece 10 is shown on positioning table 40 at a drilling station. The positioning table could be X-Y direction programmed to move through a preset sequence via a computer program. The drilling would take place in an environmental chamber to control the debris and vapors from the laser drilling and to prevent workpiece contamination. Two laser transmitting means 41 and 42 are shown, containing any required laser heads, power sources, cavity mirrors, aperture stop elements, Q switches, collimation optics, and the like, providing original laser beams 56 and 57, one of which is shown reflected at mirror 51. The laser transmitting means 41 can, however, be initially positioned so that its original laser beam 56 is 90° to original laser beam 57. In some operations only a single laser transmitting means need be used with the depth-monitoring, optical-radiation detecting means of this invention, for example, when only shallow blind holes are to be laser-drilled in a workpiece.

Figure 5:
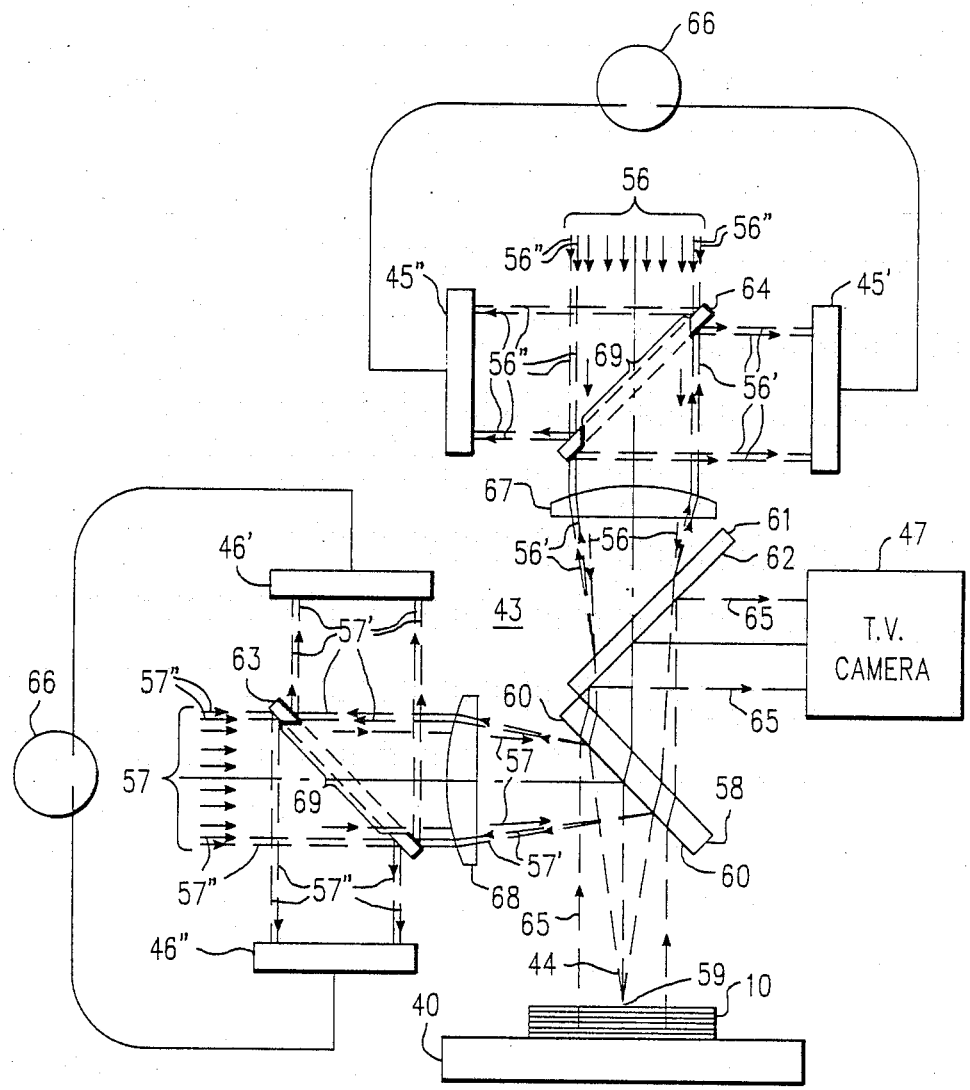
FIG. 5, which best illustrates the invention, is a schematic diagram of one embodiment of the laser focusing head which contains the combined reflected beam optical and reflected optical, radiation detection systems of this invention, which can be utilized to control laser drilling depth.

In all cases, the original laser beam has associated with it a first optical system, which can include optical elements 67, 68, 58 and 61, shown in FIG. 5, for focusing the original laser beam on the workpiece and either passing or reflecting the original laser beam to the workpiece. This first optical system is also used for passing or reflecting the laser beam reflected from the workpiece to a second optical system, which can include optical elements 63 and 64, shown in FIG. 5. The second optical system comprises means capable of reflecting a selected portion of the original laser beam into one part of detector means 45 or 46. The second optical system is also capable of reflecting a portion of the laser beam reflected from the workpiece into a second part of detector means 45 or 46. By measuring the difference in signal in the laser beam reflected from the workpiece on passage through the workpiece, contact with metal or laminate material can be quickly determined.

In the preferred embodiment shown in FIGS. 4 and 5, a long wavelength, laser transmitting means 41 is used to emit an original laser beam 56 having a power density capable of penetrating and vaporizing non-metallic material, such as organic resin impregnated fibrous material. Original laser beam 56 is reflected by mirror 51 to direct it to the workpiece 10. This long wavelength laser beam is substantially completely reflective from metal (about 90% or more) and is defined as having a wavelength of preferably from about 8 microns to about 15 microns. Such a laser could be a pulsed $CO_2$ laser type, which is well known in the art. This laser would provide an original laser beam having a wavelength, preferably of from about 9 microns to about 11 microns, usually 10.6 microns.

A short wavelength laser transmitting means 42 is used to emit an original laser beam 57, having a power density capable of penetrating and vaporizing non-metallic material, such as organic resin impregnated fibrous material, and also metal. This short wavelength laser beam has substantial reflection from metal (about 30% to about 60%) and is defined as having a wavelength of preferably from about 0.4 micron to about 3 microns. Such a laser could, preferably, be a pulsed Neodymium—YAG (neodymium doped yttrium aluminum garnet) or Neodymium-glass laser, which are both well known in the art. These lasers would provide an original laser beam having a short wavelength, preferably of from about 1 micron to about 2 microns, usually 1.06 microns. When the short wavelength laser is used, it should be operated in a pulsed mode, to control the drilling, and prevent excessive damage to both the metal cladding or vias and the insulating substrate. In most instances, only infrared radiation (over 0.78 micron wavelength) will be used to laser drill the workpiece.

Drilling depth monitoring means, shown enclosed by dashed line 43 in FIG. 4, comprises a laser-focusing head and a plurality of optical means, described in detail in FIG. 5. This drilling depth monitoring means is capable of transmitting the reflected laser beam radiation from the workpiece 10, when the focused laser beam(s) 44 contacts various components of the workpiece 10. The monitoring also contains at least two optical, radiation detectors 45 and 46, which are capable of receiving radiation and quickly converting it to electrical signals, and the whole can be utilized to control laser drilling depth.

As shown, laser beam(s) 44 is usually substantially vertical (about 90°±5°) to the workpiece. A means to measure the electrical signal, so that an increase or decrease in the radiation reflected from the workpiece, can be recorded, is associated with the signal detectors. A television camera 47 connected to a television monitor 48 can be used to observe the laser drilling at the workpiece. Positioning controls 49, connected to the positioning table 40, control aligmment of the workpiece 10, so that holes are laser-drilled at desired locations on the workpiece. After laser drilling, the workpiece is moved to a plating means station 50 to plate the surfaces of the laser-drilled holes and other portions of the workpiece as desired.

In general, a focused laser beam drills a hole by heating a small volume of material to a sufficiently high temperature for localized melting and/or vaporization to occur. The characteristics of the drilled hole will depend on a number of factors, including the laser beam power and pulse parameters, the laser wavelength, and the heat transfer properties of the material. One feature of laser drilling, which is utilized in this invention, is that a long wavelength laser beam, such as produced by a $CO_2$ laser, is readily absorbed by a dielectric material, while reflected by a metallic surface. Provided that the incident laser power onto the metallic surface is not too high, the metal is not damaged, and near total reflection of the laser beam occurs. On the other hand, a shorter wavelength laser beam, such as produced by a Neodymium—YAG laser, will be more readily absorbed by a metal surface, thereby producing a drilled hole through the metal.

If the laser beam(s) 44 of FIG. 4 was to be used to drill the through-hole 16 of FIG. 2 in workpiece 10, penetrating metal vias 13, 21, 22, 24 and 25, and laminate substrate material 26, for example epoxy resin impregnated glass fiber cloth, a short wavelength laser 42, such as a Neodymium—YAG laser, could be solely used. In this instance, the laser beam would usually be focused to converge somewhere between metal vias 21 and 24 in the workpiece, or the beam could be continuously refocused as it proceeded through the substrate.

The short wavelength laser beam would first vaporize copper wire 13, to provide a hole 16 of, for example, 2 mil (0.05 mm) diameter. A clean hole with a flat surface will result if there is good integrity between the copper and the substrate. The laser beam would then vaporize epoxy resin and glass cloth down to copper via 21 where it would contact and penetrate copper, and so on through bottom copper sheet 25 as shown in FIG. 2. Typically, the bottom hole through sheet 25 would have a diameter of about 1.5 mil (0.038 mm); i.e., it would be slightly smaller than the top hole at entry and the length of the hole through the workpiece would be slightly tapered. This would provide a ratio of entry diameter/exit diameter of 1/1.5. At each contact with copper through the laminate, a substantial amount of radiation would be reflected (about 30% to about 60%), and contact with epoxy-glass would reflect much less radiation (about 5% to about 25%), and each variation of reflected radiation would be monitored by signal detectors 46, so that depth of the laser drilling would be known. Of course, if desired, a long wavelength laser beam could be used to laser drill between the metal layers.

If the laser beam(s) 44 of FIG. 4 was to be used to drill the blind-hole 18 or 15 of FIGS. 1 and 2 on workpiece 10, through metal vias 11 or 14, and through laminate subtrate material 26, but not through metal via 23 or wire 20, both a short wavelength laser 42, such as a Nd—YAG laser, and a long wavelength laser 41, such as a $CO_2$ laser, would preferably be used. The short wavelength laser beam would first vaporize the top copper via to provide hole 18 or 15 of, for example, 2 mil diameter. A substantial amount of reflected radiation would be monitored by detector 46', which radiation monitored would drop upon entry into the laminate substrate material 26.

At that time, the short wavelength laser could be quickly turned off, or it could be allowed to penetrate close to via 23 or wire 20. Then, the long wavelength laser beam would be used to vaporize the laminate substrate material 26, where contact with the epoxy-glass would reflect minor radiation (about 5% to about 25%), down to the surface of via 23 or wire 20. This minor amount of reflected radiation would be monitored by detector 45', which radiation monitored would dramatically increase upon laser beam contact with metal, due to substantially complete reflection of the laser beam (over about 95%). Upon reaching the depth of the surface of metal via 23 or wire 20, the long wavelength laser would be quickly turned off. The turn on shut off switch could be controlled by a programmed computer or the like, receiving electrical signals directly from the detectors, thus operating as a measuring means, or from a measuring means connected to the detectors, so that laser on off reaction kime would be substantially instantaneous.

As shown in FIGS. 2 and 3, a clean, complete contact of the hole with the via or wire would result by using the apparatus of this invention, with no penetration beyond the via or wire, or hole spreading effect creating a cavity which would be difficult to plate. Thus, in both drilling examples, the depth of laser drilling could be measured by optical means, feeding reflected radiation into suitable, optical radiation detectors. In laser drilling through-hole 16, the $CO_2$ laser could be used between vias. In most operations except laser drilling close to the bottom of a blind-hole, short wavelength laser drilling is preferred, since it produces cleaner holes, having better definition and smoother sides that are easier to plate than if laser drilling is by a long wavelength laser. A suitable registering means could initially be used, prior to any laser drilling operations, to ensure proper aligmment of all the layered metallic vias or wires, so that the drilled holes do not miss imbedded vias or wires. Such registering techniques are well known in the art.

Referring now to FIG. 5, the drilling depth monitoring means 43 is shown in detail. This monitoring means contains the reflected beam optical system and the optical, radiation detection system of this invention, which, in combination, can be utilized to quickly control laser drilling depth and to prevent overrun or harm to imbedded metallic conductors. This monitoring means allows simultaneous or consecutive focusing of long wavelength laser beam 56, such as a $CO_2$ laser beam, and short wavelength laser beam 57, suc as a Neodymium—YAG laser beam, onto a point on the workpiece 10 placed on movable positioning table 40. The laser beam will enter the workpiece in a substantially transverse (about 90°±5°) direction. Components 45', 45", 46' and 46" are radiation detectors that receive and quickly measure the incident, original and reflected laser radiation. Component 47 is a television camera that provides a means for viewing the laser drilling operation via an associated television monitor.

Optical element 58, positioned above the point to be drilled in the workpiece 10 and the focal point of the laser beam 59, serves three distinct functions. Its bottom or lower surface 60 has a suitable dichroic coating so that it will reflect the original short wavelength laser beam 57 incident from the left. Application techniques for such dichroic coatings are well known in the art. The body of optical element 58 is made from a material, such as single or polycrystalline alkali salt, for example NaCl, KCl and the like, that will transmit, i.e., pass, both visible light (radiation) and the original long wavelength laser beam 56.

The optical element 61, disposed above the short wavelength laser beam reflective mirror 58, can also be made of a material such as single or polycrystalline alkali salt as described above, that will transmit both visible light (radiation) and the long wavelength laser beam 56, however its lower surface has a suitable dichroic coating so that it will have a high reflectivity to visible light, yet transmit, i.e., pass, long wavelength laser beams. Mirror 61, thus, transmits, i.e., passes, the original long wavelength laser beam 56 that is incident from above, and, by reflecting light from the workpiece into television camera 47, also provides a means for viewing the laser drilling operation via an associated television monitor. The required functions of optical elements 58 and 61 can be satisfied by present, well-known, conventional, state of the art, dichroic coating technology. The optical element 61 and television camera 47 are preferred, but other means may be utilized to view the drilling.

Thus, remembering previous discussion that the original, short wavelength laser beam radiation 57 is reflected to a substantial degree by metal, about 30% to about 60%, and that the original, long wavelength laser beam radiation 56 is substantially completely reflected by metal, about 90% or more; generally, in operation, original laser beam 57 reflects off of optical element surface 60, and, incident from above at about a 90° angle, focuses onto workpiece 10, such as the printed circuit board of FIGS. 1 and 2, where it usually contacts metal vias. The laser beam vaporizes a hole through the metal, a substantial amount of the radiation 57' being reflected back, where it is finally reflected by appropriate means 63 into a radiation detector 46'. Laser beam 56 can be utilized, where it passes through optical elements 61 and 58, and focuses onto workpiece 10. That laser beam may contact laminate substrate material, for example, epoxy resin impregnated glass fiber cloth and vaporize a hole therethrough until it contact a metal via or wire, whereupon substantially all of the long wavelength laser beam radiation 56' is reflected back through optical elements 58 and 61, and is finally reflected by appropriate means 64 into a radiation detector 45', which outputs electrical signals similarly to detector 46'. When the long wavelength laser beam 56 contacts glass-epoxy, the reflected radiation passed to detector 45' will result in a "low" signal output, but, when laser beam 56 contacts metal, where there is almost total reflection, the detector 45' will output a "high" signal. This sudden burst of signal can be monitored by a variety of measuring means, and utilized to quickly shut off the laser.

Visible light beams 65, reflect from the workpiece 10, pass through optical element 58, and are primarily reflected off of optical element surface 62, into television camera 47. Both sets of signal detectors 45', 46' and 45" and 46", which can be of well known pyroelectric, photovoltaic or heat sensitive types, are capable of quickly converting the reflected radiation they receive into an electrical signal, and are connected to means 66, such as a voltmeter, computer, or the like, to quickly measure variations in the electrical signals. The variations in electrical signals can be fed to a stop-start means, such as a programmed computer, which can substantially instantaneously stop or start both laser transmitting means. Optical element lenses 67 and 68 are effective to focus the laser beams, and are located at a position such that the laser beams come to focus at a desired position on or within the workpiece. These are movable along their axis by an appropriate means, so that the focal point can be moved if desired as a hole is laser-drilled into and through the workpiece.

Partially laser beam reflecting, partially laser beam transmitting optical members 63 and 64, are shown in FIG. 5. They can have holes through their centers, with the outer portions remaining to reflect radiation, so that an outer portion of each original laser beam, i.e., 56" and 57", is "skimmed" by the optical members and reflected to one set of detectors 45" and 46", to establish an original measure of the laser radiation level and make sure the laser continues with its initial output.

Thus, incident, long wavelength laser beam portion 56" of the original laser beam is reflected from the outer portion of optical member 64, which is reflecting to long wavelength laser beams, to the optical radiation detector 45". Reflected radiation 56' returning from the workpiece is reflected to the other optical radiation signal detector 45'. In a similar fashion, incident, short wavelength laser beam portion 57" of the original laser beam is reflected from the outer portion of optical member 63, which is reflecting to short wavelength laser beams, to the optical radiation signal detector 46". Reflected radiation 57' returning from the workpiece is reflected to the other optical radiation detector 46'. Radiation detectors 45' and 46' will record changes in the amount of radiation reflected back to them as the laser beam passes through laminate material and metal.

All of the detectors in this embodiment will have large areas to accept reflected radiation. Thus, optical members 63 and 64 have either a cutout center portion, or a center portion that transmits, i.e., passes, original laser beam radiation 57 and 56, respectively. The edge portions of optical members 63 and 64 are effective to reflect laser beam radiation 57' and 56' respectively to optical radiation detectors. The open window or transparent portions are shown as lengths 69 in FIG. 5.

The difference in signal over time sent out by optical signal detectors 45' and 46' is compared and measured by measuring means 66. Thus, the return radiation signal levels sent out or transmitted by detectors 45' and 46', from reflected laser radiation 56' and 57', will vary depending on the material the laser beam is contacting, and measuring means 66, such as a voltmeter, computer, or the like can indicate the level of difference, and pass it to a computerized laser on-off switch. This measurement can be used to differentiate when a laser contacts or passes into metal or substrate material. Even as laser drilling gets deeper and possibly some reflected radiation is absorbed exiting the workpiece, there will still be dramatic signal differences between metal and laminate material contact which are measurable by means 66 to allow start or shut down of the laser beam(s). Measuring means 66 need not be connected to detectors 45" and 46", any circuitry being used which is effective to measure difference in output signals over time from detectors 45' and 46', which receive reflected radiation from the workpiece.

Figure 6:
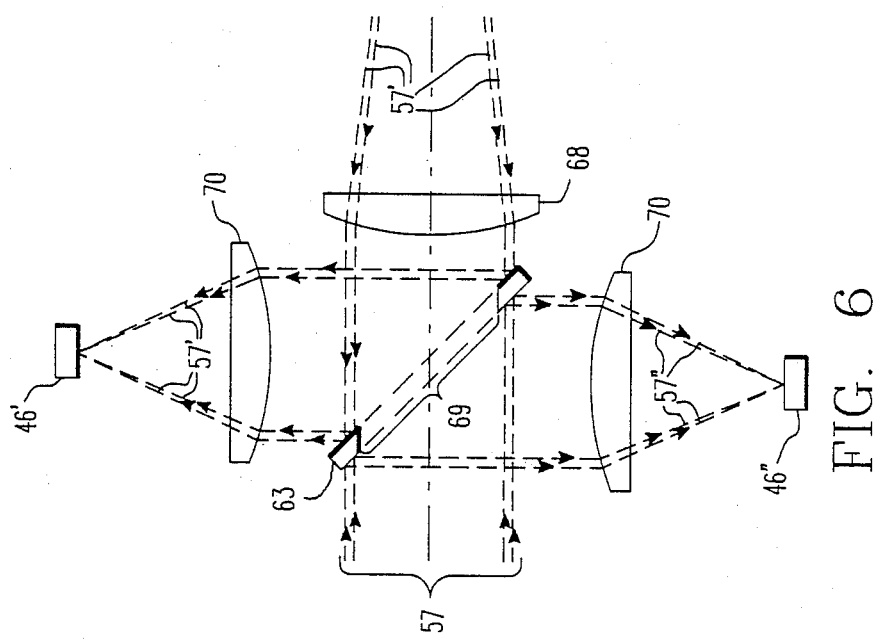
FIG. 6 is a schematic diagram of a first modified optical system useful in this invention to reduce the area required of the reflected radiation detectors.

Referring now to FIG. 6, an alternative embodiment of the optics associated with the radiation detectors and original laser beam is shown. Using, as an example, the short wavelength laser beam 57, a change has been made to incorporate additional optical element lenses 70, disposed between partially transmitting, partially reflecting optical element 63 and detectors 46' and 46", to narrow, or focus to a small area, the radiation reflected from optical element 63 onto detectors 46' and 46". This embodiment allows se of smaller area detectors. A similar change to the long wavlength radiation detectors is also part of this embodiment.

Figure 7:
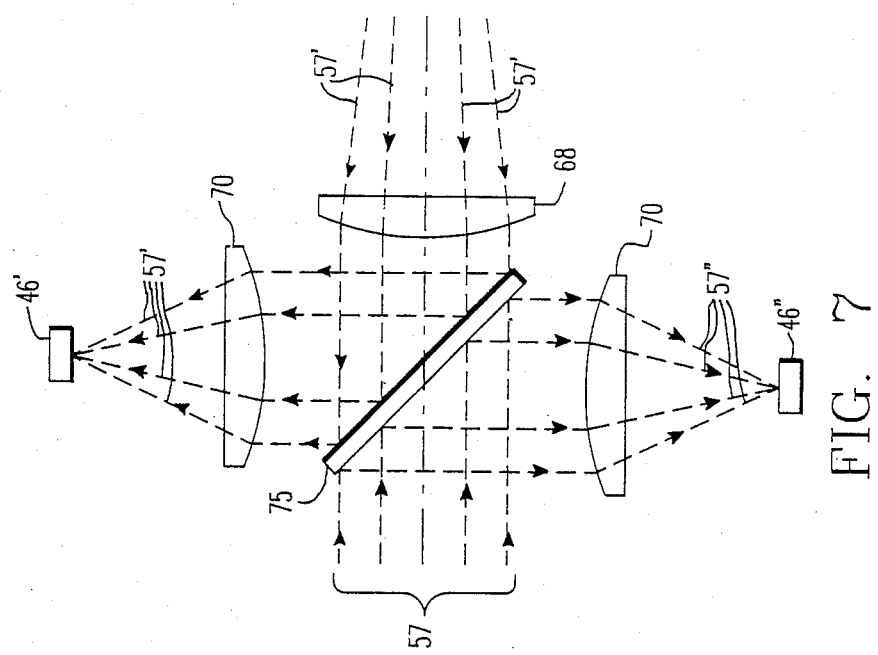
FIG. 7 is a schematic diagram of a second modified optical system useful in this invention to allow beam splitting mirrors in the reflected beam optical system of this invention.

In FIG. 7, another alternative embodiment of the optics associated with this invention is shown, again using the short wavelength laser beam 57 as an example. Partially reflecting, partially transmitting optical element 63 in FIGS. 5 and 6 is substituted for by an optical element semi-reflective of incident radiation 57. Mirror 75 reflects a known fraction of original laser beam radiation 57 and reflected radiation 57', for example, about 5% to about 20%, allowing from about 80% to about 95% of radiation transmittal. This serves the same purpose as center cut out optical element 63 in prior embodiments, and may be easier to fabricate, install, and adjust. It can also be used with the additional optical element lenses 70 shown in FIG. 7. A similar change to the long wavelength radiation detectors is also part of this embodiment.

EXAMPLE

A Control Laser Model 512QT, Neodymium—YAG laser, having a wavelength of 1.06 microns, operating in a $TEM_{00}$ mode, was used to successfully drill "through"-holes in a $3'' \times 4.5'' \times 0.03''$ thick PWB sample laminate. The laminate was made of epoxy resin impregnated glass cloth, with ⅛ ounce (0.0004 inch thick) copper cladding on both faces. A $7 \times 8$ array of 2 mil (0.002") diameter holes were drilled through the entire PWB using the laser operated at a power level of about 3 Watts, and at a pulse repetition rate of 4000 Hz. Two 100 millisecond bursts of laser pulses were required to drill the holes. The diameters of the exit holes on the backside of the PWB averaged 1.5 mil.

A Photon Sources Model V500, $CO_2$ laser, having a wavelength of 10.6 microns, and a maximum power of about 475 watts was used to successively drill "blind"-holes in a laminate. The $CO_2$ laser beam was routed via a series of mirrors to a 5-inch focal length lens, which focused the laser beam at a sample laminate comprising a top, organic resin impregnated fabric material, clad on the bottom side with 1 ounce (0.0012 inch thick) copper. A series of "blind"-holes were laser-drilled, as described in Table 1 below:

TABLE 1

| | | | | | | Sample Condition at Laser Focus For Resin-Substrate (Thickness) | | | | | | | |
|---|---|---|---|---|---|---|---|---|---|---|---|---|---|
| | | Energy | Pulse | | | Teflon-Kevlar (0.028") | | Epoxy-Kevlar (0.024") | | Polyimide-Glass (0.010") | | Epoxy-Glass (0.006") | |
| | Total | Per | | Duration | | | | | | | | | |
| Power Watts | Energy J | Pulse J/Pulse | No. # | On ms | Off ms | Observation | Dia. mil | Observation | Dia. mil | Observation | Dia. mil | Observation | Dia. mil |
| 100 | 2 | 2 | 1 | 20 | — | B,H | 12 | P | 19 | P,B | 19 | B,H | 20 |
| 100 | 2 | 0.2 | 10 | 2 | 2 | P | 14 | P | 15 | P | 20 | B,H | 20 |
| 50 | 1 | 1 | 1 | 20 | — | B | 12 | B,P | 14 | B,H | 16 | B,H | 16 |
| 50 | 1 | 0.25 | 4 | 5 | 10 | B,P | 12 | B,P | 13 | B,H | 16 | B,H | 16 |
| 50 | 1 | 0.25 | 4 | 5 | 500 | B,P | 10 | — | — | — | — | — | — |
| 50 | 0.8 | 0.1 | 8 | 2 | 500 | B | 10 | — | — | — | — | — | — |
| 50 | 0.8 | 0.05 | 16 | 1 | 500 | B | 9 | — | — | — | — | — | — |
| 50 | 0.4 | 0.1 | 4 | 2 | 500 | B | 10 | — | — | — | — | — | — |
| 50 | 0.2 | 0.1 | 2 | 2 | 50 | N | 9 | B,P | 10 | B* | 12 | B,H | 11 |
| 50 | 0.4 | 0.1 | 4 | 2 | 50 | B | 10 | B,P | 10 | B,P | 14 | B,H | 13 |
| 50 | 0.8 | 0.1 | 8 | 2 | 50 | B* | 10 | B,P | 11 | B | 16 | B,H | 16 |
| 50 | 0.2 | 0.05 | 4 | 1 | 50 | N | 10 | B | 10 | B | 11 | B*,H | 13 |
| 50 | 0.4 | 0.05 | 8 | 1 | 50 | B | 10 | B,P | 10 | B | 12 | B,H | 14 |
| 50 | 0.8 | 0.05 | 16 | 1 | 50 | B* | 10 | B,P | 11 | B | 14 | B,H | 16 |
| 50 | 0.2 | 0.1 | 2 | 2 | 500 | N | 10 | B* | 10 | B* | 12 | B,H | 12 |
| 50 | 0.4 | 0.1 | 4 | 2 | 500 | B | 10 | B,P | 10 | B | 14 | B,H | 14 |
| 50 | 0.8 | 0.1 | 8 | 2 | 500 | B* | 10 | B,P | 11 | B | 14 | B,H | 16 |
| 50 | 0.2 | 0.05 | 4 | 1 | 500 | N | 9 | B,P | 10 | B* | 12 | B,H | 12 |
| 50 | 0.4 | 0.05 | 8 | 1 | 500 | B | 10 | B,P | 10 | B | 13 | B,H | 14 |
| 50 | 0.8 | 0.05 | 16 | 1 | 500 | B* | 10 | B,P | 11 | B | 15 | B,H | 15 |

Letter Code:
N = Hole not through to copper
ms = Microseconds
Teflon = Polytetrafluoroethylene
Kevlar = Aromatic polyamide fibers
* = Best blind-hole to copper surface
B = Blind-hole to copper surface
P = Puncture copper with 2–4 mil diameter hole
H = Heating of copper evident by rings/discoloration
J = Joules As can be seen, optimum blind-hole drilling occurs in all but the epoxy-Kevlar laminates at about 50 Watts, and from about 0.2 Joules to 0.8 Joules total energy. Each resin-substrate system would have to be tailored in this regard. Laser energies of about 0.8 Joules are appropriate for Teflon-Kevlar; about 0.1 Joules may be appropriate for epoxy-Kevlar; and about 0.2 Joules appear to be appropriate for polyimide-glass and epoxy-glass, especially if thicker laminate bodies were used.

These experiments demonstrate the feasibility of using a short wavelength laser to penetrate metal portions of circuit boards and a long wavelength laser to drill through the laminate body and provide blind-holes where required. Their combination into the laser drilling system of FIGS. 4 and 5 is feasible and would be extremely useful.

We claim as our invention:

1. A controlled depth laser drilling system for a workpiece which contains metallic conductors and a substrate, the laser drilling system comprising:
   (1) a first laser transmitting means for emitting an original laser beam capable of penetrating metal and substrate material, where the substrate comprises organic resin impregnated fibrous material, and a second laser transmitting means for emitting an original laser beam capable of penetrating substrate material but substantially reflective from metal where a portion of said laser beams will be reflected from the workpiece;
   (2) drilling depth monitoring means comprising optical means capable of: (a) focusing each laser beam on the workpiece, (b) reflecting a portion of both original laser beams into a first set of radiation detector means, and (c) reflecting a portion of both laser beams reflected from the workpiece into a second set of radiation detector means, where both sets of detector means are capable of converting received radiation into an electrical signal; and
   (3) means to measure said electrical signals.

2. The laser drilling system of claim 1, where the electrical signals from the second set of radiation detector means will vary depending upon the material the original laser beam radiation contacts at the workpiece.

3. The laser drilling system of claim 1, where the optical means capable of reflecting laser beams comprises an optical member for each laser transmitting means.

4. The laser drilling system of claim 1, where the first laser transmitting means is capable of emitting a laser beam having a wavelength of from about 0.4 micron to about 3 microns, and the second laser transmitting means is capable of emitting a laser beam having a wavelength of from about 8 microns to about 15 microns.

5. The laser drilling system of claim 1, where the first laser transmitting means is selected from the group consisting of Neodymium—YAG and Neodymium glass laser transmitting means, and the second laser transmitting means is a $CO_2$ laser transmitting means.

6. The laser drilling system of claim 1, where a partially laser beam reflecting, partially laser beam transmitting optical element is the component of the optical means capable of reflecting both original laser beams and reflected laser beams to both sets of detector means.

7. The laser drilling system of claim 1, where a focusing lens is disposed between optical means capable of reflecting original and reflected laser radiation and the workpiece.

8. The laser drilling system of claim 1, where visible light is reflected from the workpiece into a television camera connected to a television monitor.

9. The laser drilling system of claim 2, where the means to measure electrical signals is effective to compare electrical signals from the second set of radiation detector means and to start and stop the laser transmitting means.

10. The laser drilling system of claim 6, where the optical element is a laser beam reflective element having a central portion removed so as to allow passage therethrough of most of the radiation.

11. The laser drilling system of claim 6, where the optical element is semi-reflective of contacting radiation, allowing from about 80% to about 95% of radiation transmittal.

12. A laser drilling system containing a laser beam for drilling holes in a substrate which contains metal material, where a portion of the laser beam may be reflected from the substrate, the laser beam having optical lens to focus the laser beam on the substrate, the improvement characterized by use of two laser beams, where the first laser beam can penetrate metal material and substrate material, and the second laser beam can penetrate substrate material but not metal material and is substantially reflective from metal material, and additional optical elements capable of reflecting a portion of reflected laser beams into a radiation detector means where the detector means converts the received radiation into an electrical signal, which electrical signal is measured.

13. The laser drilling system of claim 12, where the first laser beam is selected from the group consisting of Neodymium—YAG laser beam and a Neodymium-glass laser beam and the second laser beam is a $CO_2$ laser beam.

14. A method of drilling holes in a workpiece, where the workpiece is a multilayer circuit board laminate comprising a body of organic resin impregnated fibrous material, and metal conductors, comprising the steps of:
   (a) positioning the workpiece beneath a drilling system;
   (b) drilling holes using the laser drilling system of claim 5; and
   (c) metal plating the drilled holes.

15. The method of claim 14, where the metal conductors of the workpiece, and metal plating is selected from the group consisting of copper, aluminum, and their mixtures, and the laminate body comprises organic resin impregnated fibrous material.

16. The method of claim 15, where the resin in the body of the laminate is selected from the group consisting of phenolic resin, polyester resin, polyimide resin, polytetrafluoroethylene resin and epoxy resin, and the fibrous material in the body of the laminate is selected from the group consisting of glass fibers, quartz fibers, aromatic polyamide fibers, polyethylene terephthlate fibers, cellulosic paper fibers and their mixtures.

17. The method of claim 15, where the first laser transmitting means is used to drill through metal, and the second laser transmitting means is used to drill only through non-metal portions of the laminate body.

18. The method of claim 17, where the second laser transmitting means is effective to drill blind holes to a metal conductor in the laminate body without penetrating the metal conductor.

* * * * *